(12) United States Patent
Sakai et al.

(10) Patent No.: US 6,666,921 B2
(45) Date of Patent: Dec. 23, 2003

(54) CHEMICAL VAPOR DEPOSITION APPARATUS AND CHEMICAL VAPOR DEPOSITION METHOD

(75) Inventors: Shiro Sakai, Tokushima (JP); Yukichi Takamatsu, Kanagawa (JP); Yuji Mori, Kanagawa (JP); Hong Xing Wang, Tokushima (JP); Yoshiyasu Ishihama, Kanagawa (JP); Yutaka Amijima, Kanagawa (JP)

(73) Assignees: Japan Pionics Co., Ltd., Tokyo (JP); NPS Co., Ltd., Tokushima (JP)

( * ) Notice: Subject to any disclaimer, the term of this patent is extended or adjusted under 35 U.S.C. 154(b) by 0 days.

(21) Appl. No.: 10/079,852

(22) Filed: Feb. 22, 2002

(65) Prior Publication Data

US 2002/0160112 A1 Oct. 31, 2002

(30) Foreign Application Priority Data

Feb. 28, 2001 (JP) ........................................ 2001-053527
Mar. 29, 2001 (JP) ........................................ 2001-094610

(51) Int. Cl.⁷ ............................................... C23C 16/00
(52) U.S. Cl. ........................ 118/715; 118/725; 118/728
(58) Field of Search ................................ 118/715, 725, 118/728

(56) References Cited

U.S. PATENT DOCUMENTS

| 3,750,620 A | * | 8/1973 | Eversteijn et al. | 118/725 |
|---|---|---|---|---|
| 4,533,410 A | * | 8/1985 | Ogura et al. | 117/99 |
| 4,651,673 A | * | 3/1987 | Muething | 118/725 |
| 4,848,273 A | * | 7/1989 | Mori et al. | 118/729 |
| 5,244,501 A | * | 9/1993 | Nakayama et al. | 118/725 |
| 5,334,277 A | * | 8/1994 | Nakamura | 117/102 |
| 5,356,657 A | * | 10/1994 | Terada et al. | 427/66 |
| 5,370,738 A | * | 12/1994 | Watanabe et al. | 118/725 |
| 5,695,567 A | * | 12/1997 | Kordina et al. | 118/725 |
| 6,022,412 A | * | 2/2000 | Vincenzo et al. | 118/715 |
| 6,093,253 A | * | 7/2000 | Lofgren et al. | 118/725 |
| 6,143,128 A | * | 11/2000 | Ameen et al. | 156/345.24 |
| 6,190,457 B1 | * | 2/2001 | Arai et al. | 438/478 |
| 6,214,116 B1 | * | 4/2001 | Shin | 118/640 |
| 6,592,674 B2 | | 7/2003 | Sakai et al. | 118/715 |
| 2002/0042191 A1 | * | 4/2002 | Sakai et al. | 438/479 |
| 2002/0047127 A1 | * | 4/2002 | Nikolaev et al. | 257/82 |
| 2002/0160112 A1 | * | 10/2002 | Sakai et al. | 427/255.28 |

FOREIGN PATENT DOCUMENTS

EP          1 236 811 A2    *    9/2002

* cited by examiner

*Primary Examiner*—Jeffrie R. Lund
(74) *Attorney, Agent, or Firm*—Oblon, Spivak, McClelland, Maier & Neustadt, P.C.

(57) ABSTRACT

The present invention provides a chemical vapor deposition apparatus for a semiconductor film, containing a horizontal tubular reactor, a susceptor, a heater, a feed gas introduction portion and a reaction gas exhaust portion, where part of the tubular reactor walls inclines downward from the upstream side of the feed gas passageway towards the downstream side thereof. The present invention also provides a chemical vapor deposition method using the apparatus.

16 Claims, 4 Drawing Sheets

CHEMICAL VAPOR DEPOSITION APPARATUS AND CHEMICAL VAPOR DEPOSITION METHOD

BACKGROUND OF THE INVENTION

1. Field of the Invention

The present invention relates to a chemical vapor deposition apparatus and a chemical vapor deposition method. More particularly, it pertains to a chemical vapor deposition apparatus wherein a gas containing a feed gas is introduced at a gas introduction portion of a horizontal tubular reactor which is arranged such that the direction of the feed gas to be fed in the reactor is made substantially parallel to a substrate, so that uniform semiconductor films with favorable crystallinity are subjected to chemical vapor deposition in high efficiency on a heated substrate; and to a chemical vapor deposition method by using the aforesaid apparatus.

2. Description of the Related Arts

There has been a rapid increase in recent years, in demands for a gallium nitride compound semiconductor to be used as a device for a light emitting diode, laser diode, and the like concentratedly in the field of optical communication. There is known, for instance, as a process for manufacturing a gallium nitride compound semiconductor, a process in which a semiconductor film of a gallium nitride based compound is subjected to chemical vapor deposition on a substrate of sapphire or the like which has been set in advance in a tubular reactor so as to form an objective film by using, as a group m metal source, an organometallic gas such as trimethylgallium, trimethylindium and trimethylaluminum and by using ammonia as a nitrogen source.

In addition, there is available, as an apparatus for manufacturing the above-mentioned gallium nitride compound semiconductor, a chemical vapor deposition apparatus comprising a horizontal tubular reactor equipped with a susceptor for mounting a substrate thereon, a heater for heating the substrate, a feed gas introduction portion arranged such that the direction of the feed gas fed in a tubular reactor is made parallel to the substrate, and a reaction gas exhaust portion. The chemical vapor deposition apparatus comprising the horizontal tubular reactor is of such constitution that the substrate is placed on the susceptor in the tubular reactor, the substrate is heated, and thereafter a gas containing a feed gas is supplied in the reactor in the direction parallel to the substrate so that a semiconductor film is subjected to chemical vapor deposition to form a film on the substrate.

However, in such a horizontal tubular reactor, since the feed gas is diffused by the thermal convection in the vicinity of the substrate and does not efficiently reach the substrate, there is caused such a problem that uniform semiconductor films with favorable crystallinity are unobtainable, or the growth rate of films is low.

However, there have recently been developed an improved apparatus and method for chemical vapor deposition wherein a forcing gas introduction portion is placed on the tubular reactor wall in opposition to the substrate, a forcing gas not affecting the reaction of a carrier gas and the like is supplied inside the tubular reactor in the direction perpendicular to the substrate so as to change the feed gas stream to the direction of spraying it to a substrate. It is said that the improved apparatus and method enable to obtain uniform semiconductor films with favorable crystallinity by properly and optionally controlling the flow rate of the forcing gas in accordance with the kind and flow rate of the feed gas, temperature of the heated substrate and the like.

Nevertheless, with regard to the aforesaid method and apparatus, gas streams which cross at right angles, that is, a gas containing the feed gas and the forcing gas are mixed with each other on the substrate, and thus are more prone to be disordered, whereby the streams are often difficult to control. For instance, in the case of effecting chemical vapor deposition of a large-size substrate or simultaneously conducting that of a plurality of substrates, it is difficult to supply a feed gas in uniform concentration over a wide range of a substrate. Moreover in the case of conducting chemical vapor deposition by using the foregoing trimethylgallium, trimethylindium or trimethylaluminum as a feed gas, the necessity for a high temperature of 1000° C. or higher as the substrate heating temperature makes it difficult to control the intricate gas streams on the substrate.

SUMMARY OF THE INVENTION

Under such circumstances, an object of the invention is to provide a method and an apparatus for chemical vapor deposition that are capable of subjecting uniform semiconductor films with favorable crystallinity to chemical vapor deposition in high efficiency on a heated substrate in using a horizontal tubular reactor even in the case of conducting chemical vapor deposition of a large-sized substrate or simultaneously performing that of a plurality of substrates, or performing the same at a high vapor deposition temperature.

Other objects of the invention will become obvious from the text of this specification hereinafter disclosed. In such circumstances, intensive extensive research and development were accumulated by the present inventors in order to solve the above-described problems involved in the prior arts. As a result, it has been found that in regard to chemical vapor deposition using a horizontal tubular reactor, the feed gas stream can be changed to the direction of spraying it onto the substrate without supplying a forcing gas by installing on a tubular reactor wall in opposition to the substrate, an inclined portion inclining downward from the upstream side of the feed gas passageway towards the downstream side thereof.

It has also been found that in regard to chemical vapor deposition using a horizontal tubular reactor, disorder of the gas stream or diffusion of a feed gas each due to the thermal convection in the vicinity of the substrate can be suppressed by such a constitution that the spacing between a susceptor and a tubular reactor wall in opposition thereto is made smaller than the vertical spacing in the tubular reactor wall between a feed gas introduction portion and the susceptor. The present invention has been accomplished by the above-mentioned findings and information.

That is to say, the present invention relates to a chemical vapor deposition apparatus for a semiconductor film, which comprises a horizontal tubular reactor equipped with a susceptor for mounting a substrate thereon, a heater for heating the substrate, a feed gas introduction portion arranged such that the direction of a feed gas supplied in the tubular reactor is made substantially parallel to the substrate and a reaction gas exhaust portion, wherein the constitution of the apparatus is such that part of the tubular reactor walls in opposition to a substrate inclines downward from the upstream side of the feed gas passageway towards the downstream side thereof.

In addition, the present invention is concerned with a chemical vapor deposition method which comprises mounting a substrate on a susceptor in a horizontal tubular reactor, heating the substrate with a heater, and supplying the substrate with a gas containing a feed gas in the direction substantially parallel to the substrate so as to subject a semiconductor film to chemical vapor deposition on said substrate, wherein the direction of the gas stream is changed to an oblique downward direction by such a constitution that part of the tubular reactor walls in opposition to a substrate inclines downward from the upstream side of the feed gas passageway towards the downstream side thereof.

Moreover, the present invention pertains to a chemical vapor deposition apparatus for a semiconductor film, which comprises a horizontal tubular reactor equipped with a susceptor for mounting a substrate thereon, a heater for heating the substrate, a feed gas introduction portion arranged such that the direction of a feed gas supplied in the tubular reactor is made substantially parallel to the substrate, and a reaction gas exhaust portion, wherein the constitution of the apparatus is such that the spacing between the susceptor and the tubular reactor wall in opposition thereto is made smaller than the vertical spacing in the tubular reactor wall from a gas feed port in the feed gas introduction portion to the upstream side end of the feed gas passageway for the susceptor.

Further, the present invention is related to a chemical vapor deposition method which comprises mounting a substrate on a susceptor in a horizontal tubular reactor, heating the substrate with a heater, and supplying the substrate with a gas containing a feed gas in the direction substantially parallel to the substrate so as to subject a semiconductor film to chemical vapor deposition on said substrate, wherein the gas containing a feed gas is supplied into the horizontal tubular reactor having such a constitution that the spacing between the susceptor and the tubular reactor wall in opposition thereto is made smaller than the vertical spacing in the tubular reactor wall from a gas feed port in the feed gas introduction portion to the upstream side end of the feed gas passageway for the susceptor.

DESCRIPTION OF THE PREFERRED EMBODIMENTS

Figure 1:
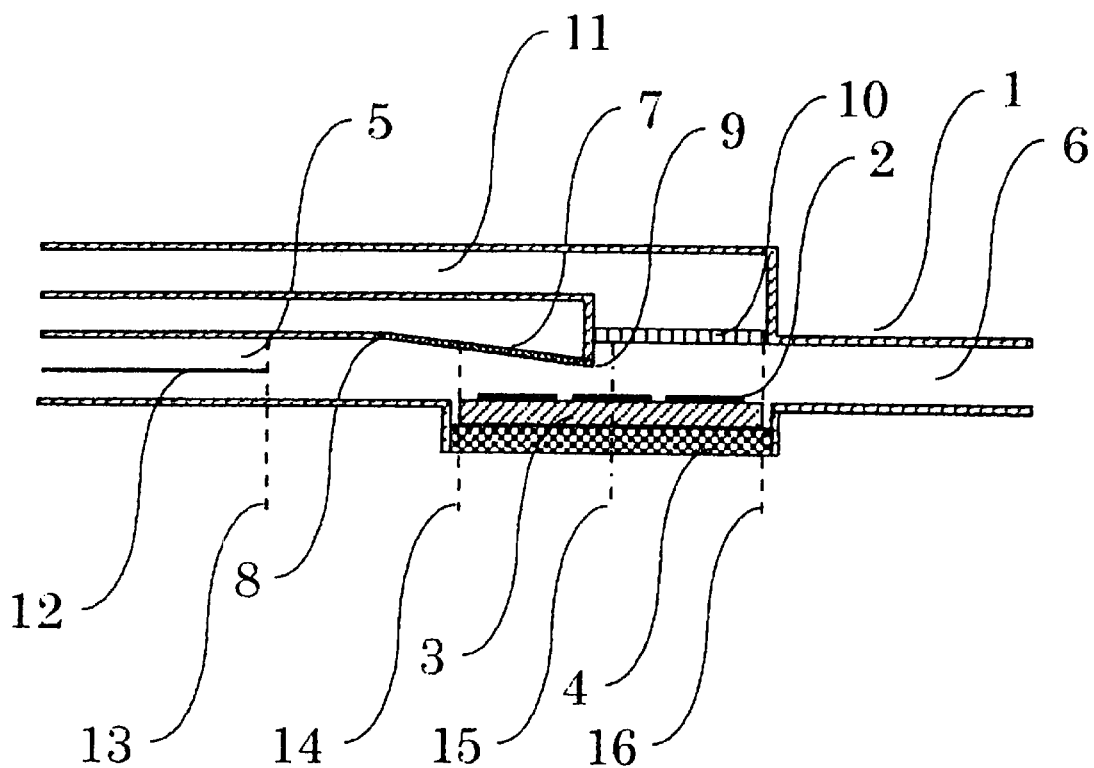
FIG. 1 and FIG. 2 are each a vertical cross-sectional view showing one example of a chemical vapor deposition apparatus according to the present invention.

The chemical vapor deposition apparatus and the chemical vapor deposition method according to the present invention are applied to a chemical vapor deposition apparatus and chemical vapor deposition method, respectively, wherein a substrate is placed on a susceptor in a horizontal tubular reactor and is heated with a heater, and thereafter a gas containing a feed gas is supplied in the direction parallel to the substrate, so that a semiconductor film is formed on the substrate through chemical vapor deposition.

The chemical vapor deposition apparatus according to the present invention is such an apparatus that part of the tubular reactor walls in opposition to a substrate inclines downward from the upstream side of the feed gas passageway towards the downstream side thereof, or that the spacing between the susceptor and the tubular reactor wall in opposition thereto is made smaller than the vertical spacing in the tubular reactor wall from a gas feed port in the feed gas introduction portion to the upstream side end of the feed gas passageway for the susceptor. In addition, the chemical vapor deposition method according to the present invention is such a method for conducting chemical vapor deposition in which the direction of the gas stream is changed to an oblique downward direction by such a constitution that part of the tubular reactor walls in opposition to a substrate inclines downward from the upstream side of the feed gas passageway towards the downstream side thereof, or the gas containing a feed gas is supplied into the horizontal tubular reactor having such a constitution that the spacing between the susceptor and the tubular reactor wall in opposition thereto is made smaller than the vertical spacing in the tubular reactor wall from a gas feed port in the feed gas introduction portion to the upstream side end of the feed gas passageway for the susceptor.

In regard to the apparatus and method for chemical vapor deposition according to the present invention, there is not any limitation on any of the kind, size and the number of substrates, and the kind and flow rate of the feed gas.

However, the apparatus and method for chemical vapor deposition according to the present invention are characterized by their capability of sufficiently exhibiting the working effects thereof in that disorder of the gas and diffusion of the feed gas each due to thermal convection can be alleviated over a wide range of a substrate, particularly in the case of carrying out the chemical vapor deposition of a large-sized substrate having a diameter of at least 4 inches (101.6 mm, approx.) or simultaneously conducting that of 6 numbers of substrates. The kinds of the substrate are exemplified by sapphire, SiC, bulk gallium nitride, etc.

In addition, the present apparatus and method for chemical vapor deposition are characterized by their capability of sufficiently exhibiting the working effects thereof in that in the case of performing chemical vapor deposition which needs a substrate heating temperature of 1000° C. or higher depending upon the kind of a feed gas, sharp disorder of gas and diffusion of the feed gas each due to thermal convection can be alleviated. The chemical vapor deposition using such feed gas is exemplified by chemical vapor deposition which is directed to a gallium nitride compound semiconductor and in which use is made of trimethylgallium, triethylgallium, trimethylindium, triethylindium, trimethylaluminum or triethylaluminum as a source of group III metal, and ammonia, monomethylhydrazine, dimethylhydrazine, tert-butylhydrazine or trimethylamine as a nitrogen source.

In what follows, detailed description will be given of the chemical vapor deposition apparatus according to the present invention with reference to the attached drawings, which however shall never limit the present invention thereto.

FIG. 1 is a vertical cross-sectional view showing one example of a chemical vapor deposition apparatus according to the present invention. According to FIG. 1, the present chemical vapor deposition apparatus is composed of a horizontal tubular reactor 1 equipped with a substrate 2, a susceptor 3 for holding and rotating the substrate, a heater 4 for heating the substrate, a feed gas introduction portion 5 arranged so that the direction of a feed gas supplied into the tubular reactor becomes substantially parallel to the substrate and a reaction gas exhaust portion 6, wherein the constitution of the apparatus is such that part of the tubular reactor walls (tubular reactor wall portion 7) in opposition to a substrate inclines downward from the upstream side of the feed gas passageway towards the downstream side thereof.

In the aforesaid chemical vapor deposition apparatus, the inclined tubular reactor wall portion is located at or in the vicinity of the position where the stream of a gas containing a feed gas begins to be thermally influenced by the heater. Accordingly, the position where the inclined tubular reactor wall portion is located varies depending upon the flow rate of the gas, the position of the heater, chemical vapor deposition temperature, the size and type of the horizontal tubular reactor and the like factors, and thus can not be unequivocally defined. Usually, the inclined tubular reactor wall portion is located between a gas feed port in the feed gas introduction portion and the position corresponding to the downstream side end of the feed gas passageway for the susceptor, that is, in the region between positions 13 and 16 in FIG. 1. Preferably however, the inclined tubular reactor wall portion is located so that the upstream side end 8 of the inclined tubular reactor wall portion is placed between a gas feed port in the feed gas introduction portion and the position corresponding to the upstream side end of the feed gas passageway for the susceptor (between positions 13 and 14), and the downstream side end 9 of the inclined tubular reactor wall portion is placed between the position corresponding to the upstream side end of the feed gas passageway for the susceptor and the position corresponding to the downstream side end of the feed gas passageway for the susceptor (between positions 14 and 16).

More preferably, the inclined tubular reactor wall portion is located so that the upstream side end 8 of the inclined tubular reactor wall portion is placed between a gas feed port in the feed gas introduction portion and the position corresponding to the upstream side end of the feed gas passageway for the susceptor (between positions 13 and 14), and the downstream side end 9 of the inclined tubular reactor wall portion is placed between the position corresponding to the upstream side end 14 of the feed gas passageway for the susceptor and the position corresponding to the center 15 of the feed gas passageway for the susceptor as illustrated in FIG. 1.

In the above-mentioned chemical vapor deposition apparatus, the length and angle of inclination for the inclined tubular reactor wall portion are properly and optionally set according to the type, flow rate and concentration of the gas, conditions of chemical vapor deposition, and the size and shape of the horizontal tubular reactor and the like factors, and thus can not be unequivocally defined. The length of the inclined tubular reactor wall portion in the direction of feed gas passageway is usually about 0.2 to 1.5 times the diameter of the susceptor. The angle of inclination to the direction of feed gas passageway is usually about 0.1 to 10 degrees, preferably about 0.2 to 5 degrees. The angle of inclination, when being less than 0.1 degree, is relatively less effective in changing the gas stream to an oblique downward direction, whereas the angle, when being more than 10 degrees, brings about sharp change of the gas stream, causing a fear of exerting adverse influence upon the chemical vapor deposition. The minimum distance between the inclined tubular reactor wall portion and the substrate is usually at most 20 mm, preferably at most 10 mm.

The preseint horizontal tubular reactor as illustrated in FIG. 1 involves a problem in that since the tubular reactor wall portion in opposition to the substrate are heated to a high temperature, there is caused a thermal decomposition reaction of the feed gas in the vicinity thereof, whereby decomposed products or reaction products are more apt to deposit on the tubular reactor wall portion. It is preferable therefore, that the surfaces of the inclined tubular reactor wall portion be constituted of quartz which is less apt to deposit decomposed products or reaction products thereon. Since decomposed products or reaction products are most likely to deposit on the tubular reactor walls that are adjacent to the downstream side of the inclined tubular reactor wall portion, it is further preferable to adopt such a constitution that is capable of suppressing the deposit of decomposed products or reaction products in the case of chemical vapor deposition by installing as illustrated in FIG. 1, a multi-micropore portion 10 having gas permeability and an introduction portion 11 for supplying the inside of the tubular reactor through the multi-micropore portion with a gas free from the feed gas. Although deposit of decomposed products or reaction products can be suppressed by constituting the inclined tubular reactor wall portion of a multi-micropore material and supplying the inside of the tubular reactor through the multi-micropore portion with a gas free from the feed gas, there is caused a fear that the feed gas is diffused depending on the flow rate of the gas through the multi-micropore portion. Thus it is preferable to suppress the deposit by adopting quartz as the constitutional material for the surfaces of the inclined tubular reactor wall portion instead of the constitution just mentioned.

Figure 2:
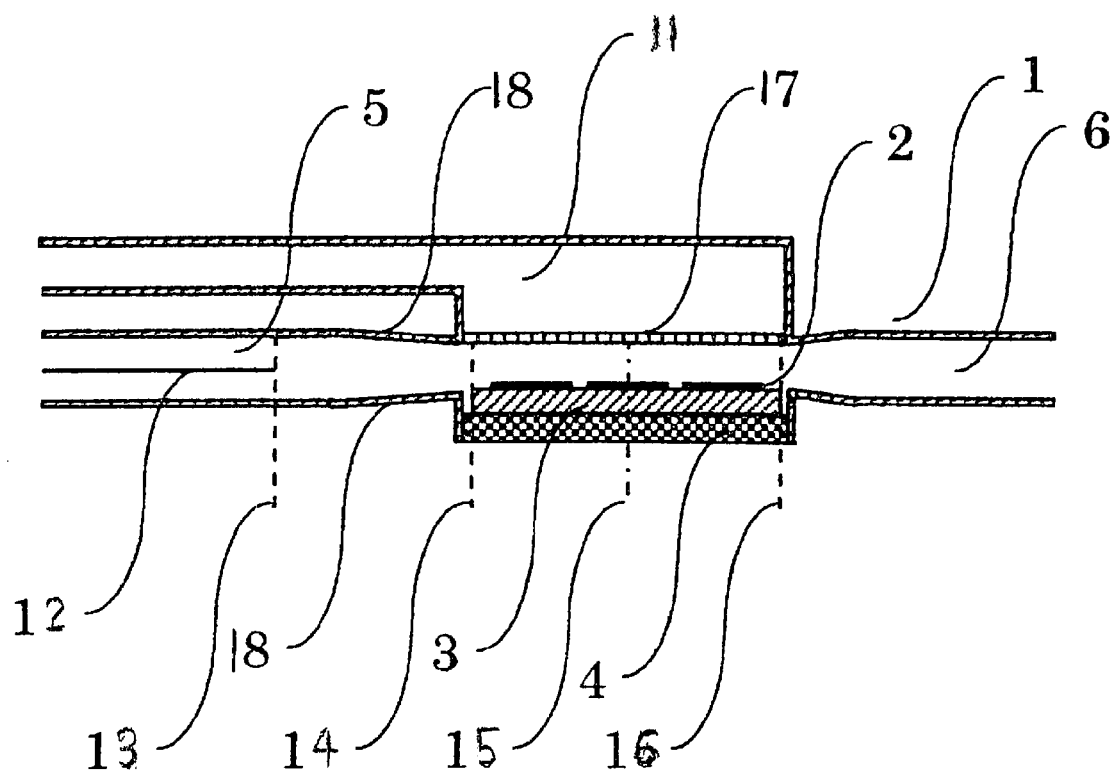

FIG. 2 is another vertical cross-sectional view showing one example of a chemical vapor deposition apparatus according to the present invention. According to FIG. 2, the present chemical vapor deposition apparatus is composed of a horizontal tubular reactor 1 equipped with a substrate 2, a susceptor 3 for holding and rotating the substrate, a heater 4 for heating the substrate a feed gas introduction portion 5 placed so that the direction of a feed gas supplied into the tubular reactor comes to be substantially parallel to the substrate and a reaction gas exhaust portion 6, wherein the constitution of the apparatus is such that the spacing between the susceptor 3 and the tubular reactor wall 17 in opposition thereto is made smaller than the vertical spacing in the tubular reactor wall 18 from a gas feed port 13 in the feed gas introduction portion to the upstream side end 14 of the feed gas passageway for the susceptor 3.

In the aforesaid chemical vapor deposition apparatus, the average spacing between the susceptor and the tubular reactor wall in opposition thereto is 20 to 99%, preferably 30 to 95% of the vertical spacing in the tubular reactor wall from a gas feed port in the feed gas introduction portion to the upstream side end of the feed gas passageway for the susceptor. In the case where the spacing between the susceptor and the tubular reactor wall in opposition thereto is less than 20% of the vertical spacing in the tubular reactor wall from a gas feed port in the feed gas introduction portion to the upstream side end of the feed gas passageway for the susceptor, the flow velocity of a gas containing a feed gas is made unreasonably high, thereby causing a fear that the feed gas which has not yet been sufficiently used for chemical vapor deposition reaction is exhausted from a reaction gas exhaust portion. Conversely in the case where the aforesaid spacing is more than 99% thereof the gas stream is disordered by thermal convection in the vicinity of the substrate, or the working effect on suppressing diffusion of feed gas is lessened. In order to achieve the aforesaid constitution in the chemical vapor deposition apparatus, it is designed so that the vertical spacing in the tubular reactor wall begins to be made smaller from the upstream to downstream usually at a position between a gas feed port 13 in the feed gas introduction portion and the upstream side end 14 of the feed gas passageway for the susceptor, and so that the spacing between the susceptor and the tubular reactor wall portion corresponding thereto is made constant at the place where the susceptor is arranged (between the positions 14 and 16). In the chemical vapor deposition apparatus as illustrated in FIG. 2, it is designed so that the spacing in the tubular reactor wall 18 between the positions 13 and 14 is made smaller towards the downstream direction by both the inclined upper and lower tubular reactor walls. However, it is possible to design so that the spacing is made smaller towards the downstream direction by inclining either of the upper tubular reactor wall or the lower one. In the case of such constitution, the spacing between the susceptor and the tubular reactor wall in opposition thereto is preferably 10 to 98% of the vertical spacing in the tubular reactor wall at a gas feed port 5 in the feed gas introduction portion. The spacing between the susceptor and the reactor wall in opposition to the susceptor is usually 20 mm or less, preferably 10 mm or less.

The present horizontal tubular reactor as illustrated in FIG. 2 involves a problem in that since the tubular reactor wall portion in opposition to the susceptor are heated to a high temperature, there is caused a thermal decomposition reaction of the feed gas in the vicinity thereof, thus making it more apt to deposit decomposed products or reaction products on the tubular reactor wall portion. It is preferable therefore to adopt such a constitution capable of suppressing the deposit of decomposed products or reaction products in the case of chemical vapor deposition by setting up a multi-micropore portion having gas permeability on the tubular reactor wall portion 17 in opposition to the susceptor and also an introduction portion 11 for supplying the inside of the tubular reactor through the multi-micropore portion with a gas free from the feed gas. Instead of the constitution as the above, the surfaces of the tubular reactor wall portion in opposition to the susceptor can be constituted of quartz which is less apt to deposit decomposed products or reaction products thereon.

The foregoing constitution according to the present invention is applicable to any of the chemical vapor deposition apparatus having single gas feed port in a feed gas introduction portion and the apparatus wherein the gas passageway in a feed gas introduction portion is partitioned into upper and lower gas passageways with a partition plate or a nozzle. The constitution in which the gas passageway is partitioned into upper and lower gas passageways is exemplified by a chemical vapor deposition apparatus in which the upper gas passageway is used for supplying a gas containing trimethylgallium, triethylgallium, trimethylindium, triethylindium, trimethylaluminum or triethyl aluminum, and the lower gas passageway is used for supplying ammonia, monomethylhydrazine, dimethylhydrazine, tert-butylhydrazine or trimethylamine.

In the following, detailed description will be given of the chemical vapor deposition method according to the present invention.

The chemical vapor deposition method is a method for subjecting the substrate to chemical vapor deposition to form a semiconductor film thereon by using the aforesaid chemical vapor deposition apparatus as illustrated for instance, in FIG. 1, wherein the direction of the gas stream is changed to an oblique downward direction by such a constitution that part of the tubular reactor walls in opposition to a substrate inclines downward from the upstream side of the feed gas passageway towards the downstream side thereof.

In the present chemical vapor deposition method, the position at which the direction of the gas stream is changed to an oblique downward direction usually lies between the feed gas introduction portion and the position corresponding to the upstream side end of the feed gas passageway for the susceptor (between positions 13 and 14), and the gas stream direction after the foregoing change is usually about 0.1 to 10 degrees downward to the direction of feed gas passageway. In the foregoing chemical vapor deposition method, the gas velocity is made higher in the vicinity of upstream side of the susceptor by the inclined tubular reactor wall portion. Hence, the chemical vapor deposition reaction tends to occur on the more downstream side as compared with conventional horizontal tubular reactors. Thus the reactor can easily be designed so that the progress of chemical vapor deposition reaction reaches a peak in a region between a position corresponding to the center of the susceptor and a position corresponding to the downstream side end thereof. Such design enables to distribute deposit of decomposed products or reaction products in less quantity on the inclined tubular reactor wall portion than on the downstream side thereof.

In the case of the foregoing design, it is preferable to adopt such a constitution capable of suppressing the deposit of decomposed products or reaction products in the case of chemical vapor deposition by setting up a multi-micropore portion having gas permeability on tubular reactor walls on the downstream side of the inclined tubular reactor wall portion, and supplying the inside of the tubular reactor through the multi-micropore portion with a gas which is free from a feed gas.

It is also preferable in conducting chemical vapor deposition to allow the substrate to rotate and/or revolve. The gas which is free from a feed gas and which is used in the chemical vapor deposition method according to the present invention is not specifically limited, provided that the reaction is not adversely affected thereby. The gas can be selected for use from hydrogen and nitrogen as well as an inert gas such as helium and argon.

As another chemical vapor deposition method according to the present invention, there can be exemplified a method for subjecting the substrate to chemical vapor deposition to form a semiconductor film by using the chemical vapor deposition apparatus as illustrated in FIG. 2, which comprises supplying a gas containing a feed gas into a horizontal tubular reactor, wherein the spacing between the susceptor and the tubular reactor wall in opposition thereto is made smaller than the vertical spacing in the tubular reactor wall from a gas feed port in the feed gas introduction portion to the upstream side end of the feed gas passageway for the susceptor.

It is preferable in the foregoing method to suppress the deposit of decomposed products or reaction products so as to conduct chemical vapor deposition by placing a multi-micropore portion having gas permeability on tubular reactor wall portion in opposition to the susceptor, and supplying the inside of the tubular reactor through the multi-micropore portion with a gas free from a feed gas. The gas free from a feed gas is not specifically limited provided that the reaction is not adversely affected thereby. The gas can be selected for use from hydrogen and nitrogen as well as an inert gas such as helium and argon.

In the chemical vapor deposition method, gas velocity is made higher in the region where the spacing is small between the susceptor and the tubular reactor wall portion in opposition thereto. Hence, the reaction tends to occur on the more downstream side compared with conventional horizontal tubular reactors. Thus the reactor can easily be designed so that the progress of the reaction reaches a peak in a region between a position corresponding to the center of the susceptor 15 and a position corresponding to the downstream side end thereof. Such design enables to distribute deposit of decomposed products or reaction products in less quantity on the tubular reactor wall portion in opposition to the susceptor than on the tubular reactor wall portion on the downstream side, thus enabling to prevent the deposit from dropping on the substrate.

The chemical vapor deposition method according to the present invention is widely applicable to chemical vapor deposition at a temperature ranging from a relatively low temperature of about 600° C. as a highest heating temperature of a substrate to a relatively high temperature of 1000° C. or higher. It is also possible in the chemical vapor deposition method according to the present invention to set the pressure in a horizontal tubular reactor on atmospheric pressure, reduced pressure or increased pressure of about 0.1 MPa/cm$^2$ G.

By the term "feed gas" as used herein is meant a gas which serves as a supply source for an element which is incorporated in crystal as a crystal-constituting element. Such feed gas for chemical vapor deposition varies depending upon the objective semiconductor film, and is selected for use from among metal hydride such as arsine, phosphine and silane; organometal compounds such as trimethylgallium, trimethylindium and trimethylaluminum; ammonia; hydrazine and alkylamines. As a gas containing a feed gas, there is usable any of the above-cited feed gas diluted with a gas such as hydrogen, helium, argon and nitrogen.

In summarizing the working effects and advantages of the present invention, the apparatus and method for chemical vapor deposition have enabled to subject uniform semiconductor films with favorable crystallinity to chemical vapor deposition on a substrate in high efficiency even in the case of carrying out chemical vapor deposition of a large-sized substrate, or simultaneously conducting that of a plurality thereof, or conducting the same at elevated temperatures.

In what follows, the present invention will be described in more detail with reference to comparative examples and working examples, which however shall never limit the invention thereto.

EXAMPLE 1

<Preparation of Chemical Vapor Deposition Apparatus>

A chemical vapor deposition apparatus was prepared which had the constitution same as that shown in the vertical cross-sectional view on FIG. 1, and which was composed of quartz-made horizontal tubular reactor having an inside width of 280 mm (multi-micropore portion), an inside height of 20 mm (multi-micropore portion) and an inside length of 1500 mm. A susceptor and a heater each in circular form had an outside diameter of 260 mm. One substrate having a diameter of 2 inches (50.8 mm, approx.) was placed in the central portion of the susceptor, and five substrates were each placed at a same spacing in the peripheral portion of the susceptor so as to enable to simultaneously process the substrates in six numbers. In addition, there was installed an inclined tubular reactor wall portion the surface of which was made of quartz and which had a length of 18 cm in the direction of feed gas passageway so that center position thereof corresponded to the upstream side end of the susceptor, and the angle of inclination was 1.5 degree to the direction of the feed gas passageway.

<<Experiment on Chemical Vapor Deposition>>

By the use of the chemical vapor deposition apparatus thus prepared, GaN crystal growth was effected on the sapphire substrates each having a diameter of 2 inches (50.8 mm. approx.) in the following manner.

The sapphire substrates were each fixed to the susceptor, the atmosphere in the reactor was replaced with hydrogen gas, then hydrogen at a flow rate of 65 L (liter)/min was supplied through an upper gas passageway of a feed gas introduction portion, and hydrogen as a gas free from a feed gas, at a flow rate of 20 L/min was supplied through the multi-micropore portion, while heating the substrates to 1150° C. to carry out a heat treatment of the substrates for 10 minutes.

Subsequently, the reaction temperature of the substrates was lowered to 500° C., and the substrates were allowed to stand until it was stabilized. Then, a mixed gas of ammonia and hydrogen (40 L/min of ammonia and 10 L/min of hydrogen) was supplied through a lower gas passageway of the feed gas introduction portion, hydrogen gas containing trimethylgallium (240 micromole/min of trimethylgallium and 50 L/min of hydrogen) was supplied through the upper gas passageway of the feed gas introduction portion and at the same time, 50 L/min of nitrogen was supplied through the multi-micropore portion to carry out chemical vapor deposition of GaN at a low temperature for 5 minutes.

After the formation of a growth layer at a low temperature, the supply of trimethylgallium was ceased, the temperature was raised to 1100° C., and the layer was allowed to stand until it was stabilized. Next, hydrogen gas containing trimethylgallium (240 micromole/min of trimethylgallium and 50 L/min of hydrogen) was again supplied through the upper gas passageway of the feed gas introduction portion and at the same time, 50 L/min of nitrogen was supplied through the multi-micropore portion to carry out chemical vapor deposition of GaN for 60 minutes during which time the susceptor and the substrates were rotated at 12 r.p.m. and 36 r.p.m., respectively. In this manner, the chemical vapor deposition was carried out 5 times repeatedly.

<<Evaluation of GaN Film, etc.>>

After the completion of the chemical vapor deposition, the tubular reactor wall in opposition to the substrates was checked for the existence of solid adhesion. As a result, no solid adhesion was observed. Thereafter, the substrates were taken out, and a measurement was made of film thickness distribution from the center of each of the substrates towards the periphery thereof, taking into consideration rotation of the substrates during the chemical vapor deposition to evaluate the uniformity of the film thickness. In Table 1 are given the results of the measurements of the film thickness and variation range thereof {(maximum−minimum)/average} for the one substrate placed in the central portion of the susceptor and also five substrates placed in the peripheral portion thereof. Further, in order to evaluate the crystal quality and electrical characteristics of the deposited film, measurements were made of X-ray diffraction {half-value width of (002) face} and hole (mobility) for the six substrates. The results are also given in Table 1, in which the value for the substrates in the peripheral portion indicates the average of five values, and the same applies to each of the following examples.

EXAMPLE 2

A chemical vapor deposition apparatus was prepared in the same manner as in Example 1, except that angle of inclination of the inclined tubular reactor wall portion was altered to 0.5 degree to the direction of feed gas passageway. Subsequently, experiments on chemical vapor deposition and evaluation of GaN film, etc. were put into practice in the same manner as in Example 1, except that use was made of the chemical vapor deposition apparatus just described. The results are also given in Table 1.

EXAMPLE 3

A chemical vapor deposition apparatus was prepared in the same manner as in Example 1, except that angle of inclination of the inclined tubular reactor wall portion was altered to 1.85 degree to the direction of feed gas passageway. Subsequently, experiments on chemical vapor deposition and evaluation of GaN film, etc. were put into practice in the same manner as in Example 1, except that use was made of the chemical vapor deposition apparatus just described. The results are also given in Table 1.

EXAMPLE 4

A chemical vapor deposition apparatus was prepared in the same manner as in Example 1, except that angle of inclination of the inclined tubular reactor wall portion was altered to 3.0 degrees to the direction of feed gas passageway. Subsequently, experiments on chemical vapor deposition and evaluation of GaN film, etc. were put into practice in the same manner as in Example 1, except that use was made of the chemical vapor deposition apparatus just described. The results are also given in Table 1.

COMPARATIVE EXAMPLE 1

A chemical vapor deposition apparatus was prepared in the same manner as in Example 1, except that the tubular reactor wall portion in opposition to the substrate was not inclined. Subsequently, experiments on chemical vapor deposition and evaluation of GaN film, etc. were put into practice in the same manner as in Example 1, except that use was made of the chemical vapor deposition apparatus just described. The results are also given in Table 1.

TABLE 1

| | Angle of inclination (degree) | Substrate position | Film thickness ($\mu$m) | Variation range (%) | Half-value width (arcsec) | Mobility ($cm^2$/vs) | Solid adhesion |
|---|---|---|---|---|---|---|---|
| Example 1 | 1.5 | central | 1.46 | 1 | 267 | 225 | none |
| | | periph'l | 1.37 | 2 | 272 | 223 | |
| Example 2 | 0.5 | central | 1.29 | 1 | 332 | 191 | none |
| | | periph'l | 1.15 | 2 | 329 | 187 | |
| Example 3 | 1.85 | central | 1.00 | 2 | 320 | 197 | none |
| | | periph'l | 0.86 | 2 | 348 | 201 | |
| Example 4 | 3.0 | central | 0.92 | 2 | 350 | 183 | none |
| | | periph'l | 0.88 | 2 | 349 | 181 | |
| Comp. Example 1 | 0 | central | 0.87 | 2 | 368 | 182 | none |
| | | periph'l | 0.85 | 2 | 347 | 176 | |

{Remarks} central: central portion, periph'l: peripheral portion

A chemical vapor deposition apparatus was prepared which had the constitution same as that shown in the vertical cross-sectional view on FIG. 2, and which was composed of quartz-made horizontal tubular reactor having an inside width of 280 mm (multi-micropore portion) and an inside length of 1500 mm. The vertical spacing in the tubular reactor wall at the gas feed port of the feed gas introduction portion was set on 20 mm, and the spacing between the susceptor and the tubular reactor wall portion in opposition thereto was set on 14 mm.

In addition, the tubular reactor wall between the feed gas introduction portion and the susceptor was designed according to such constitution that both the upper and lower tubular reactor walls were inclined at a position of 120 mm upstream side from the upstream side end of the susceptor. Further, the angles of inclination of the tubular reactor walls to the direction of the feed gas passageway were designed such that the angle of inclination of the upper tubular reactor wall was twice that of the lower tubular reactor wall. A susceptor and a heater each in circular form had an outside diameter of 260 mm. One substrate having a diameter of 2 inches (50.8 mm, approx.) was placed in the central portion of the susceptor, and five substrates were each placed at a same spacing in the peripheral portion of the susceptor so as to enable to simultaneously process the substrates in six numbers.

Figure 3:
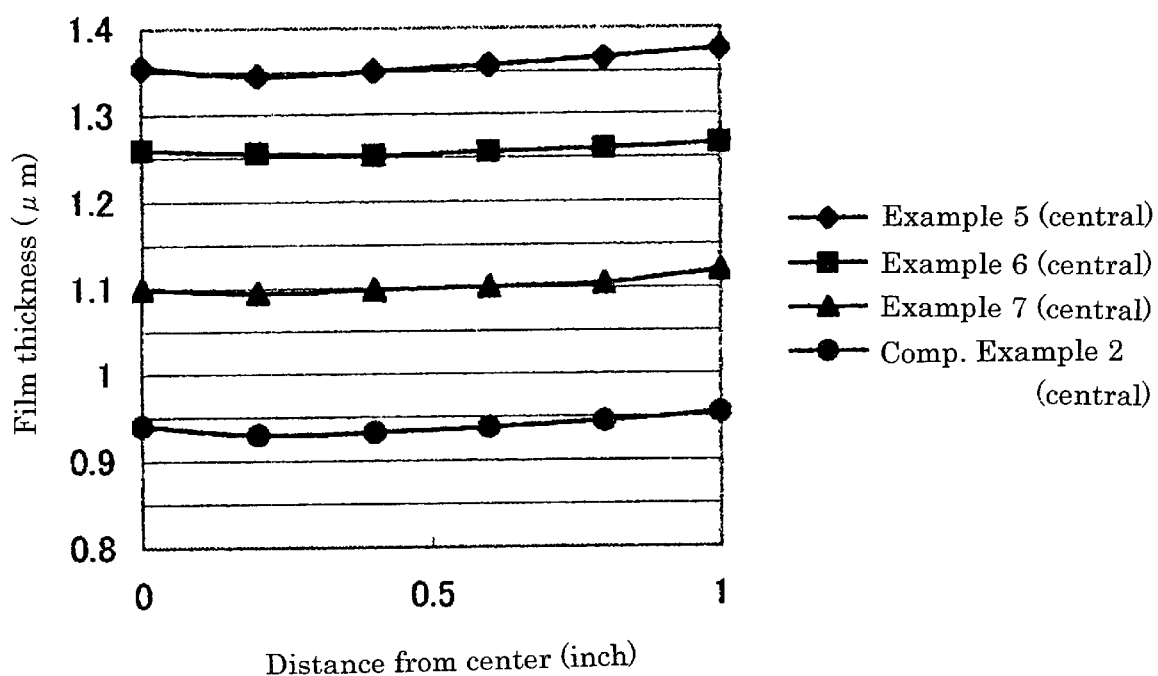
FIG. 3 is a graph showing the state of film thickness distribution in examples and comparative examples of the present invention, wherein a substrate is placed in the central portion of a susceptor.
Figure 4:
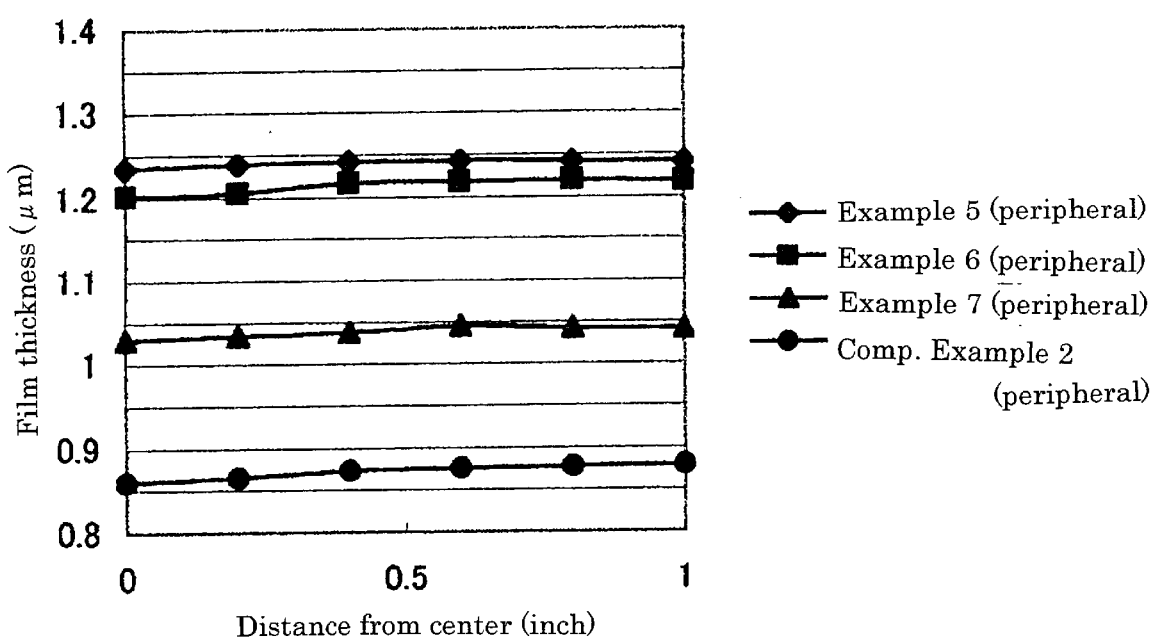
FIG. 4 is a graph showing the state of film thickness distribution in examples and comparative examples, wherein a substrate is placed in a peripheral portion of a susceptor.

Subsequently, experiments on chemical vapor deposition and evaluation of GaN film, etc. were put into practice in the same manner as in Example 1, except that use was made of the chemical vapor deposition apparatus just described. After the completion of chemical vapor deposition, no solid adhesion was observed on the tubular reactor wall in opposition to the substrates. The substrates were taken out, and a measurement was made of film thickness distribution from the center of each of the substrates towards the periphery thereof, taking into consideration rotation of the substrates during the chemical vapor deposition to evaluate the uniformity of the film thickness. In Table 2 are given the results of the measurements of the film thickness and variation range thereof {(maximum-minimum)/average} for the one substrate placed in the central portion of the susceptor and also five substrates placed in the peripheral portion thereof. Further, the states of film thickness distribution are given in FIG. 3 and FIG. 4. In order to evaluate the crystal quality and electrical characteristics of the deposited film, measurements were made of X-ray diffraction {half-value width of (002) face} and hole (mobility) for the six substrates. The results are also given in Table 2, in which the value for the substrates in the peripheral portion indicates the average of five values, and the same applies to each of the following examples.

EXAMPLE 6

A chemical vapor deposition apparatus was prepared in the same manner as in Example 5, except that the vertical spacing in the tubular reactor wall at the gas feed port of the feed gas introduction portion was set on 18 mm instead of 20 mm. Subsequently, experiments on chemical vapor deposition and evaluation of GaN film, etc were put into practice in the same manner as in Example 5, except that use was made of the chemical vapor deposition apparatus just described. The results are also given in Table 2, FIG. 3 and FIG. 4.

EXAMPLE 7

A chemical vapor deposition apparatus was prepared in the same manner as in Example 5, except that the vertical spacing in the tubular reactor wall at the gas feed port of the feed gas introduction portion was set on 16 mm instead of 20 mm. Subsequently, experiments on chemical vapor deposition and evaluation of GaN film, etc. were put into practice in the same manner as in Example 5, except that use was made of the chemical vapor deposition apparatus just described. The results are also given in Table 2, FIG. 3 and FIG. 4.

COMPARATIVE EXAMPLE 2

A chemical vapor deposition apparatus was prepared in the same manner as in Example 5, except that the vertical spacing in the tubular reactor wall at the gas feed port of the feed gas introduction portion was equalized to the spacing between the susceptor and the tubular reactor wall in opposition thereto. Subsequently, experiments on chemical vapor deposition and evaluation of GaN film, etc. were put into practice in the same manner as in Example 5, except that use was made of the chemical vapor deposition apparatus just described. The results are also given in Table 2, FIG. 3 and FIG. 4.

TABLE 2

|  | Spacing (mm) | | Substrate position | Film thickness ($\mu$m) | Variation range (%) | Half-value width (arcsec) | Mobility ($cm^2$/vs) | Solid adhesion |
| --- | --- | --- | --- | --- | --- | --- | --- | --- |
|  | a | b |  |  |  |  |  |  |
| Example 5 | 20 | 14 | central | 1.36 | 2 | 272 | 221 | none |
|  |  |  | periph'l | 1.24 | 1 | 289 | 215 |  |
| Example 6 | 18 | 14 | central | 1.26 | 1 | 295 | 218 | none |
|  |  |  | periph'l | 1.21 | 2 | 312 | 214 |  |
| Example 7 | 16 | 14 | central | 1.11 | 2 | 320 | 193 | none |
|  |  |  | periph'l | 1.04 | 2 | 345 | 188 |  |
| Comp. Example 2 | 14 | 14 | central | 0.94 | 2 | 336 | 191 | none |
|  |  |  | periph'l | 0.87 | 2 | 347 | 178 |  |

{Remarks}
central: central portion, periph'l: peripheral portion
Spacing a: vertical spacing in tubular reactor wall at gas feed port of feed gas introduction portion
Spacing b: spacing between susceptor and tubular reactor wall portion in opposition thereto It has been recognized from the foregoing results that the apparatus and method for chemical vapor deposition according to the present invention are capable of assuring GaN films excellent in crystallinity and electrical characteristics in chemical vapor deposition which is used for GaN films and which necessitates a temperature of 1000° C. or higher without being affected by the position whether it is a central position or a peripheral position.

What is claimed is:

1. A chemical vapor deposition apparatus for a semiconductor film, which comprises a horizontal tubular reactor equipped with a susceptor for mounting a substrate thereon, a heater for heating the substrate, a feed gas introduction portion arranged such that the direction of a feed gas supplied in the tubular reactor is made substantially parallel to the substrate and a reaction gas exhaust portion, wherein the constitution of the apparatus is such that part of the tubular reactor walls in opposition to a substrate inclines downward from the upstream side of the feed gas passageway towards the downstream side thereof,
   wherein the inclined tubular reactor wall portion is located so that the upstream side end of the inclined tubular reactor wall portion is placed between a gas feed port in the feed gas introduction portion and the position corresponding to the upstream side end of the feed gas passageway for the susceptor, and the downstream side end of the inclined tubular reactor wall portion is placed between the position corresponding to the upstream side end of the feed gas passageway for the susceptor and the position corresponding to the center of the feed gas passageway for the susceptor.

2. The chemical vapor deposition apparatus according to claim 1 wherein the length of the inclined tubular reactor wall portion in the direction of the feed gas passageway is 0.2 to 1.5 times the diameter of the susceptor.

3. The chemical vapor deposition apparatus according to claim 1 wherein the angle of inclination of the inclined tubular reactor wall portion is 0.1 to 10 degrees to the direction of the feed gas passageway.

4. The chemical vapor deposition apparatus according to claim 1 wherein the horizontal tubular reactor is further equipped on a tubular reactor wall on the downstream side of the inclined tubular reactor wall portion with a multi-micropore portion having gas permeability and an introduction port for supplying the inside of the tubular reactor with a gas free from a feed gas through said multi-micropore portion.

5. The chemical vapor deposition apparatus according to claim 1 wherein the surface of the inclined tubular reactor wall portion is made of quartz as the constructional material.

6. The chemical vapor deposition apparatus according to claim 1, wherein the apparatus is of such constitution that a plurality of substrates are mounted on the susceptor.

7. The chemical vapor deposition apparatus according to claim 1, wherein the apparatus is of such constitution that a large-size substrate having a size of at least 4 inches (101.6 mm, approx.) is mounted on the susceptor.

8. The chemical vapor deposition apparatus according to claim 1, wherein the apparatus is of such constitution that the gas passageway in the feed gas introduction portion is partitioned into upper gas passageway and lower gas passageway with a partition plate or a nozzle.

9. The chemical vapor deposition apparatus according to claim 8, wherein the upper gas passageway in the feed gas introduction portion is a passageway for the supply of a gas containing trimethylgallium, triethylgallium, trimethylindium, triethylindium, trimethylaluminum or triethylaluminuml, and the lower gas passageway in the feed gas introduction portion is a passageway for the supply of ammonia, monomethylhydrazine, dimethylhydrazine, tert-butylhydrazine or trimethylamine.

10. A chemical vapor deposition apparatus for a semiconductor film, which comprises a horizontal tubular reactor equipped with a susceptor for mounting a substrate thereon, a heater for heating the substrate, a feed gas introduction portion arranged such that the direction of a feed gas supplied in the tubular reactor is made substantially parallel to the substrate, and a reaction gas exhaust portion, wherein
   the constitution of the apparatus is such that the spacing between the susceptor and the tubular reactor wall in opposition thereto is smaller than the vertical spacing in the tubular reactor wall from a gas feed port in the feed gas introduction portion to the upstream side end of the feed gas passageway for the susceptor;
   a portion of the upper and the lower walls of the tubular reactor are inclined beginning at a position in the upstream feed gas introduction portion of the tubular reactor and ending at a position at the upstream side end of the susceptor; and
   the spacing between the susceptor and the tubular reactor wall in opposition thereto is made constant at the place where the susceptor is arranged.

11. The chemical vapor deposition apparatus according to claim 10 wherein the spacing between the susceptor and the tubular reactor wall in opposition thereto is 20 to 99% in average of the vertical spacing in the tubular reactor wall from a gas feed port in the feed gas introduction portion to the upstream side end of the feed gas passageway for the susceptor.

12. The chemical vapor deposition apparatus according to claim 10, wherein the spacing between the susceptor and the tubular reactor wall in opposition thereto is 10 to 98% of the vertical spacing in the tubular reactor wall at a gas feed port in the feed gas introduction portion.

13. The chemical vapor deposition apparatus according to claim 10, wherein the horizontal tubular reactor is further equipped on a tubular reactor wall portion in opposition to the susceptor with a multi-micropore portion having gas permeability and an introduction port for supplying the inside of the tubular reactor with a gas free from a feed gas through said multi-micropore portion.

14. The chemical vapor deposition apparatus according to claim 8, wherein the apparatus is of such constitution that a plurality of substrates are mounted on the susceptor.

15. The chemical vapor deposition apparatus according to claim 10, wherein the apparatus is of such constitution that a large-size substrate having a size of at least 4 inches (101.6 mm, approx.) is mounted on the susceptor.

16. The chemical vapor deposition apparatus according to claim 10, wherein the apparatus is of such constitution that the gas passageway in the feed gas introduction portion is partitioned into upper gas passageway and lower gas passageway with a partition plate or a nozzle.

* * * * *

UNITED STATES PATENT AND TRADEMARK OFFICE
CERTIFICATE OF CORRECTION

PATENT NO.    : 6,666,921 B2
DATED         : December 23, 2003
INVENTOR(S)   : Sakai et al.

It is certified that error appears in the above-identified patent and that said Letters Patent is hereby corrected as shown below:

<u>Title page,</u>
Item [73], Assignee, should read:
-- Assignees:  Japan Pionics Co., Ltd., Tokyo (JP);
             Tokushima Sanso Co., Ltd., Tokushima, (JP) --

Signed and Sealed this

Eleventh Day of May, 2004

JON W. DUDAS
*Acting Director of the United States Patent and Trademark Office*